US012765247B2

(12) United States Patent
Shin et al.

(10) Patent No.: US 12,765,247 B2
(45) Date of Patent: Oct. 13, 2026

(54) OPTICAL CONTROL PANEL AND DISPLAY APPARATUS INCLUDING ORGANIC PATTERNS

(71) Applicant: Samsung Display Co., Ltd., Yongin-si (KR)

(72) Inventors: Hyuneok Shin, Yongin-si (KR); Joonyong Park, Yongin-si (KR); Juhyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 454 days.

(21) Appl. No.: 18/321,920

(22) Filed: May 23, 2023

(65) Prior Publication Data

US 2024/0090305 A1 Mar. 14, 2024

(30) Foreign Application Priority Data

Sep. 8, 2022 (KR) ........................ 10-2022-0114492

(51) Int. Cl.

| | |
|---|---|
| ***H10K 59/80*** | (2023.01) |
| ***G09G 3/3233*** | (2016.01) |
| ***H10K 59/12*** | (2023.01) |
| ***H10K 59/40*** | (2023.01) |

(52) U.S. Cl.

CPC ....... *H10K 59/8792* (2023.02); *G09G 3/3233* (2013.01); *H10K 59/1201* (2023.02); *H10K 59/40* (2023.02); *H10K 59/873* (2023.02); *G09G 2300/0842* (2013.01); *G09G 2354/00* (2013.01); *H10K 59/12* (2023.02)

(58) Field of Classification Search

CPC .. H10K 59/8792; H10K 59/40; H10K 59/873; H10K 59/875; H10K 59/126; H10K 59/8791; H10K 59/131; H10K 59/12; H10K 50/865; H10K 50/85; H10K 50/844; G09G 3/3233

See application file for complete search history.

(56) References Cited

U.S. PATENT DOCUMENTS

| | | | | |
|---|---|---|---|---|
| 10,191,318 | B2 * | 1/2019 | Park | G02F 1/133377 |
| 10,680,209 | B2 | 6/2020 | Park et al. | |
| 2006/0038937 | A1 * | 2/2006 | Kaneko | G02F 1/1365 349/110 |
| 2020/0168844 | A1 * | 5/2020 | Kim | H10K 59/352 |
| 2020/0219935 | A1 * | 7/2020 | Ahn | H10K 59/8792 |

(Continued)

FOREIGN PATENT DOCUMENTS

| | | | | |
|---|---|---|---|---|
| CN | 101764145 | | 6/2010 | |
| CN | 112186000 A | * | 1/2021 | H10K 59/8792 |

(Continued)

*Primary Examiner* — Ida M Soward

(74) *Attorney, Agent, or Firm* — Womble Bond Dickinson (US) LLP

(57) ABSTRACT

A display apparatus including an optical control panel. The optical control panel includes a base film, a first transmissive layer disposed on the base film, a first organic layer disposed on the first transmissive layer, the first organic layer including first organic patterns that extend in a first direction, and a first light-shielding layer disposed on an upper and on side surfaces of the first organic patterns, the first light-shielding layer also including a plurality of grooves exposing at least a part of the first transmissive layer.

16 Claims, 14 Drawing Sheets

(56) References Cited

U.S. PATENT DOCUMENTS

| | | | | |
|---|---|---|---|---|
| 2020/0273929 | A1* | 8/2020 | Kim | H10K 59/38 |
| 2020/0312916 | A1* | 10/2020 | Kim | H10K 59/38 |
| 2020/0321400 | A1* | 10/2020 | Park | H10K 59/38 |
| 2020/0365833 | A1* | 11/2020 | Joo | H10K 59/38 |
| 2020/0373513 | A1* | 11/2020 | Kim | H10K 59/38 |
| 2020/0388663 | A1* | 12/2020 | Lee | H10K 59/122 |
| 2021/0013440 | A1* | 1/2021 | Kim | H10K 50/19 |
| 2021/0181385 | A1 | 6/2021 | Song et al. | |
| 2021/0376015 | A1 | 12/2021 | Lim et al. | |
| 2021/0391389 | A1* | 12/2021 | Ryu | H10K 59/38 |
| 2021/0391390 | A1* | 12/2021 | Yoon | H10K 59/38 |
| 2021/0405409 | A1* | 12/2021 | Na | G02F 1/1368 |
| 2022/0028953 | A1* | 1/2022 | Jang | H10K 59/122 |
| 2022/0076621 | A1* | 3/2022 | Seo | G09G 3/3208 |
| 2022/0158049 | A1* | 5/2022 | Itou | G09F 9/33 |
| 2022/0199935 | A1* | 6/2022 | Uhm | H10K 50/846 |
| 2022/0328581 | A1* | 10/2022 | Kim | H10K 59/122 |
| 2023/0028409 | A1* | 1/2023 | Kim | H10K 59/38 |
| 2023/0126517 | A1* | 4/2023 | Lee | H10K 59/352<br>257/40 |
| 2023/0333421 | A1* | 10/2023 | Liou | G02F 1/1323 |

FOREIGN PATENT DOCUMENTS

| | | | | | |
|---|---|---|---|---|---|
| KR | 10-2007-0071902 | | | 7/2007 | |
| KR | 10-2009-0108592 | A | | 10/2009 | |
| KR | 10-2013-0002528 | A | | 1/2013 | |
| KR | 10-2021-0074641 | | | 6/2021 | |
| KR | 10-2021-0076477 | | | 6/2021 | |
| KR | 10-2021-0147136 | A | | 12/2021 | |
| KR | 20220065919 | A | * | 5/2022 | H10K 59/88 |
| WO | WO-2022075534 | A1 | * | 4/2022 | H10K 59/8792 |

* cited by examiner

OPTICAL CONTROL PANEL AND DISPLAY APPARATUS INCLUDING ORGANIC PATTERNS

CROSS-REFERENCE TO RELATED APPLICATION

This application claims priority from and benefits of Korean Patent Application No. 10-2022-0114492 under 35 U.S.C. § 119, filed on Sep. 8, 2022 in the Korean Intellectual Property Office (KIPO), the contents of which in its entirety are herein incorporated by reference.

BACKGROUND

1. Technical Field

One or more embodiments relate to a display apparatus and a method of manufacturing the display apparatus with improved product reliability and viewability, and a method of manufacturing the display apparatus.

2. Description of the Related Art

Recently, the usage of display apparatuses has diversified. As display apparatuses have become thinner and more lightweight, the range of use thereof has widened. As display apparatuses have become widely used in various fields, demand for display apparatuses providing high-quality images has increased. Recently, a display apparatus may be arranged within a vehicle such that an image may be provided to a user sitting in a driver's seat or a passenger seat.

SUMMARY

Light emitted from a display apparatus arranged within a vehicle may be reflected off of a window of the vehicle and reach a user. This may cause the driver's vision to be compromised while driving, presenting a safety concern while driving.

One or more embodiments include a display apparatus in which a viewing angle of light emitted from the display apparatus may be limited, and a method of manufacturing the display apparatus. However, the one or more embodiments may be only examples, and the scope of the disclosure may not be limited thereto.

Additional aspects will be set forth in part in the description that follows and, in part, will be apparent from the description, or may be learned by practice of the embodiments of the disclosure.

According to one or more embodiments, an optical control panel includes a base film, a first transmissive layer disposed on the base film, a first organic layer disposed on the first transmissive layer, the first organic layer including a plurality of first organic patterns that extend in a first direction, and a first light-shielding layer disposed on upper surface and on side surfaces of the plurality of first organic patterns, wherein the first light-shielding layer includes a plurality of grooves exposing at least a part of an upper surface of the first transmissive layer.

Ones of plurality of first organic patterns spaced-apart from each other by certain intervals in a second direction intersecting the first direction.

The optical control panel may further include a second transmissive layer disposed on the first light-shielding layer and filling the plurality of grooves, wherein the second transmissive layer includes a transmissive organic material.

The first light-shielding layer may include a metal oxide.

The first light-shielding layer may include a first layer surrounding ones of the plurality of first organic patterns, a second layer surrounding the first layer, and a third layer surrounding the second layer, wherein the second layer may include a first metal element, and each of the first layer and the third layer may include an oxide of the first metal element.

The first metal element may include a material selected from copper (Cu), molybdenum (Mo), or a combination thereof, and the oxide of the first metal element may be selected from a copper oxide ($CuO_x$), a molybdenum oxide ($MoO_x$), or a combination thereof.

A thickness of each of the first layer and the third layer may be substantially uniform. The base film may include polyimide (PI).

The first transmissive layer may include a material selected from a group consisting of amorphous indium tin oxide (a-ITO), polycrystalline indium tin oxide (p-ITO), or a combination thereof.

According to one or more embodiments, a display apparatus includes a display area and a non-display area, a display layer disposed on a substrate in the display area and including a pixel circuit and a light-emitting diode, an encapsulation layer disposed on the display layer, and an optical control panel disposed on the encapsulation layer, wherein the optical control panel includes a first organic layer disposed on the encapsulation layer, the first organic layer including a plurality of first organic patterns that extend in a first direction, and a first light-shielding layer disposed on an upper surface and on side surfaces of the plurality of first organic patterns in a plan view, the first light-shielding layer including a metal layer and a metal oxide layer, the metal layer including a first metal element, the metal oxide layer including an oxide of the first metal element.

The first metal element may include a metal selected from copper (Cu), molybdenum (Mo), or a combination thereof, and the oxide of the first metal element may include a material selected from a group consisting of a copper oxide ($CuO_x$), molybdenum oxide ($MoO_x$), or a combination thereof.

The optical control panel may further include a first transmissive layer disposed under the first organic layer in a plan view, and the first transmissive layer may include a material selected from a group consisting of an amorphous indium tin oxide (a-ITO), a polycrystalline indium tin oxide (p-ITO), or a combination thereof.

The display apparatus may further include a touch sensor layer disposed between the encapsulation layer and the optical control panel.

The display apparatus may further include a second transmissive layer disposed in an area between neighboring ones of the plurality of first organic patterns, wherein the second transmissive layer includes a transmissive organic material.

The metal layer may include a first metal layer, the metal oxide layer may include a first metal oxide layer and a second metal oxide layer, the first metal oxide layer may surround the plurality of organic patterns, the first metal layer may surround the first metal oxide layer, and the second metal oxide layer may surround the first metal layer, the first metal oxide layer and the second metal oxide layer may each include a material selected from a group consisting of a copper oxide ($CuO_x$), a molybdenum oxide ($MoO_x$), or a combination thereof, the first metal layer may include a material selected from a group consisting of copper (Cu), molybdenum (Mo), or a combination thereof.

A thickness of each of the first metal oxide layer and the second metal oxide layer may be substantially uniform.

According to one or more embodiments, a method of manufacturing a display apparatus includes forming a display layer on a substrate, the display layer comprising a pixel circuit and a light-emitting diode, forming an encapsulation layer on the display layer, and forming an optical control panel on the encapsulation layer, wherein the forming of the optical control panel includes forming a first transmissive layer on a base film, forming a first organic layer on the first transmissive layer, the first organic layer comprising a plurality of first organic patterns that extend in the first direction, and forming a first light-shielding layer on the first organic layer.

The forming of the first transmissive layer may include depositing amorphous indium tin oxide (a-ITO) on the base film, and forming polycrystalline indium tin oxide (p-ITO) by performing heat treatment on the a-ITO.

The heat treatment may include heating the a-ITO to about 200° C. or greater for about 20 minutes to about 30 minutes.

The forming of the first light-shielding layer may include depositing a metal element selected from a group consisting of copper (Cu), molybdenum (Mo), or a combination thereof on the first transmissive layer and on the first organic layer, and performing a heat treatment on the metal element.

The performing of the heat treatment on the metal element may include forming from the metal element a first layer surrounding ones of the plurality of first organic patterns, a second layer surrounding the first layer, and a third layer surrounding the second layer, the first layer and the third layer may each include a material selected from a group consisting of copper oxide ($CuO_x$), a molybdenum oxide ($MoO_x$), or a combination thereof, the second layer may the metal element.

The performing of the heat treatment on the metal element may include heating the metal element to a temperature of about 200° C. or greater for about 20 minutes to about 30 minutes in an oxygen ($O_2$) atmosphere.

The forming of the optical control panel further may include lifting off and removing a partial area of the first light-shielding layer, the partial area being between neighboring ones of the plurality of first organic patterns and in physical contact with the first transmissive layer.

The method may further include detaching the base film from the first transmissive layer, and attaching the optical control panel onto the encapsulation layer.

The attaching of the optical control panel onto the encapsulation layer may include forming a touch sensor layer on the encapsulation layer, and attaching the optical control panel onto the touch sensor layer.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
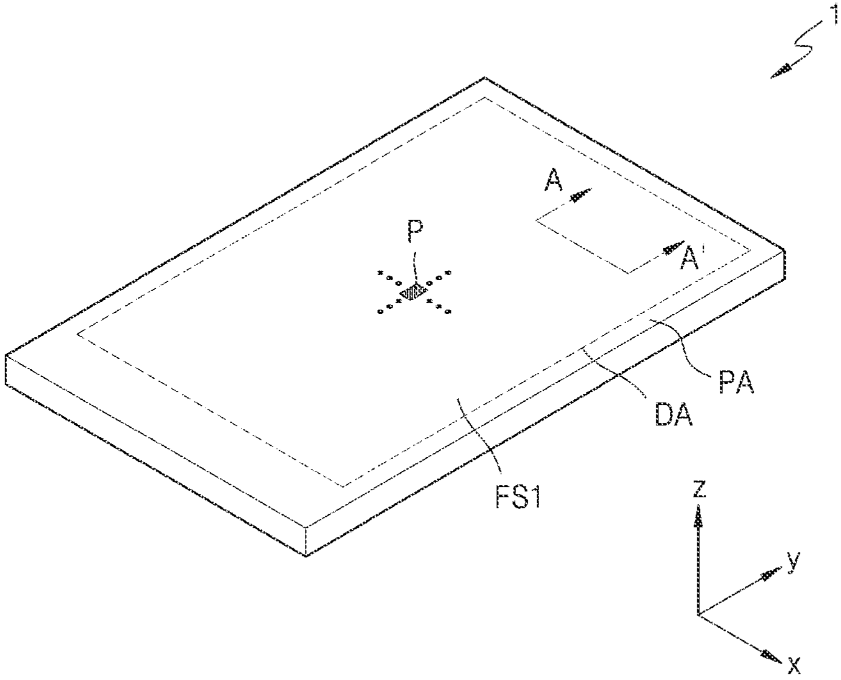
FIG. 1 is a perspective view schematically illustrating a display apparatus according to an embodiment.

Reference will now be made in detail to embodiments, examples of which may be illustrated in the accompanying drawings, wherein like reference numerals refer to like elements throughout. In this regard, the embodiments may have different forms and should not be construed as being limited to the descriptions set forth herein. Accordingly, the embodiments may be merely described below, by referring to the figures, to explain aspects of the description.

As the disclosure allows for various changes and numerous embodiments, certain embodiments will be illustrated in the drawings and described in detail in the written description. Hereinafter, effects and features of the disclosure and a method for accomplishing them will be described more fully with reference to the accompanying drawings, in which embodiments of the disclosure may be shown. This disclosure may however be embodied in many different forms and should not be construed as being limited to the embodiments set forth herein.

Hereinafter, embodiments will be described with reference to the accompanying drawings, wherein like reference numerals refer to like elements throughout and a repeated description thereof may be omitted. As used herein, the term “and/or” includes any and all combinations of one or more of the associated listed items. For example, “A and/or B” may be understood to mean “A, B, or A and B.” Throughout the disclosure, the expression “at least one of a, b, or c” indicates only a, only b, only c, both a and b, both a and c, both b and c, all of a, b, and c, or any variations thereof. Also, “at least one of X, Y, and Z” and “at least one selected from the group consisting of X, Y, and Z” may be construed as X only, Y only, Z only, or any combination of two or more of X, Y, and Z.

In embodiments below, terms, such as “first” and “second,” may be used herein merely to describe a variety of elements, but the elements may not be limited by the terms. Such terms may be used only for the purpose of distinguishing one element from another element.

In embodiments below, an expression used in the singular encompasses the expression of the plural, unless it has a clearly different meaning in the context.

In embodiments below, it will be further understood that the terms “comprises” and/or “comprising” used herein specify the presence of stated features or elements, but do not preclude the presence or addition of one or more other features or elements.

“ ” Sizes of elements in the drawings may be exaggerated or reduced for convenience of explanation. For example, since sizes and thicknesses of elements in the drawings may be arbitrarily illustrated for convenience of explanation, the disclosure may not be limited thereto.

In case that an embodiment may be implemented differently, a certain process order may be performed differently from the described order. For example, two consecutively described processes may be performed substantially at a same time or performed in an order opposite to the described order.

It will be understood that when a layer, region, or element may be referred to as being "connected" to another layer, region, or element, it may be "directly connected" to the other layer, region, or element or may be "indirectly connected" to the other layer, region, or element with other layers, regions, or elements therebetween. For example, it will be understood that when a layer, region, or element may be referred to as being "electrically connected" to another layer, region, or element, it may be "directly electrically connected" to the other layer, region, or element or may be "indirectly electrically connected" to other layers, regions, or elements with other layer, region, or element therebetween. It will be understood that when a layer, region or element is referred to as being "formed on" another layer, region or element, it can be directly or indirectly formed on the other layer, region or element. In other words, intervening layers, regions or elements may be present.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms may be intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

Unless otherwise defined or implied herein, all terms (including technical and scientific terms) used herein have a same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
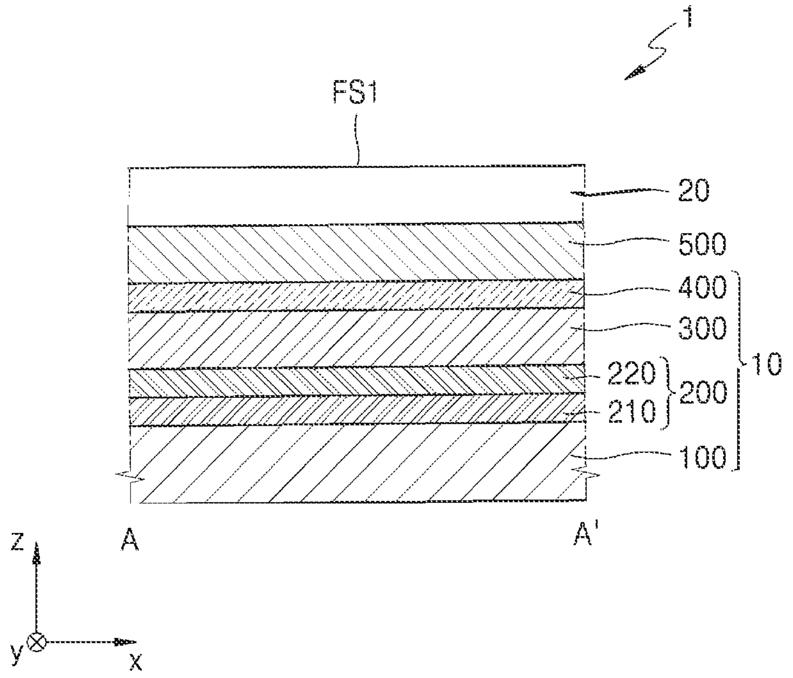
FIG. 2 is a schematic cross-sectional view of the display apparatus illustrated in FIG. 1 taken along line A-A'.

FIG. 1 is a perspective view schematically illustrating a display apparatus 1 according to an embodiment, and FIG. 2 is a schematic cross-sectional view of the display apparatus 1 taken along line A-A' shown in FIG. 1.

Referring to FIG. 1, the display apparatus 1 according to an embodiment may include a display area DA and a peripheral area (or non-display area) PA. The peripheral area PA may be arranged outside the display area DA to surround the display area DA. Various lines and a driving circuit part, which may be configured to transfer electrical signals to be transmitted to the display area DA, may be disposed in the peripheral area PA. The display apparatus 1 may provide an image by using light emitted from a plurality of pixels arranged in the display area DA.

Hereinafter, an organic light-emitting display may be described as an example of the display apparatus. However, the display apparatus of the disclosure is not limited thereto. The display apparatus 1 may be a display apparatus such as an organic light-emitting display, an inorganic light-emitting display (or an inorganic electroluminescent (EL) display), or a quantum dot light-emitting display.

The display apparatus 1 may be implemented as an electronic apparatus of various types. In an embodiment, the display apparatus 1 may be a display apparatus for a vehicle. However, the display apparatus of the disclosure is not limited thereto.

As shown in FIG. 2, the display apparatus 1 may include a display panel 10, an optical control panel 500, and a cover window 20. The display panel 10 may include a substrate 100, a display layer 200, an encapsulation layer 300, and a touch sensor layer 400, which may be sequentially stacked on each other in a third direction (e.g., a z direction).

The substrate 100 may include a glass material or polymer resin. For example, the substrate 100 may include a glass material with silicon oxide ($SiO_x$) as a main component or may include polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The display layer 200 may be disposed on the substrate 100. The display layer 200 may include a pixel circuit layer 210 including a pixel circuit and insulating layers, and a display element layer 220 including a light-emitting diode. The display element layer 220 may be disposed on the pixel circuit layer 210, and the plurality of insulating layers may be disposed between the pixel circuit and the light-emitting diode. Some lines and insulating layers of the pixel circuit layer 210 may extend into the peripheral area PA.

The encapsulation layer 300 may be disposed on the display layer 200. The encapsulation layer 300 may seal the light-emitting diodes disposed in the display element layer 220. In an embodiment, the encapsulation layer 300 may include at least one inorganic encapsulation layer and at least one organic encapsulation layer. The at least one inorganic encapsulation layer may include one or more inorganic materials from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), silicon oxynitride (SiON), or a combination thereof. The at least one organic encapsulation layer may include a polymer-based material, an acrylate or a combination thereof. The polymer-based material may include an acryl-based resin, an epoxy-based resin, polyimide, polyethylene, or a combination thereof.

The touch sensor layer 400 may be disposed on the encapsulation layer 300. The touch sensor layer 400 may be a layer for sensing a touch input of a user and may detect the touch input by using at least one of various touch methods, such as a resistive film method and a capacitive type method. The touch sensor layer 400 may be disposed on an upper surface of the encapsulation layer 300, as shown in FIG. 2, but the touch sensor layer 400 may instead be disposed between the encapsulation layer 300 and the display layer 200. The touch sensor layer 400 may be separately formed and attached to the encapsulation layer 300 or may be formed (e.g., directly formed) as a pattern on the encapsulation layer 300.

The optical control panel 500 may be disposed on the touch sensor layer 400. The optical control panel 500 may at least partially absorb external light or internally reflected light and limit a viewing angle of light emitted from the display element layer 220. For example, the optical control panel 500 may transmit light emitted perpendicular to a front surface FS1 of the display apparatus 1 and block light emitted at an angle of less than or equal to about 45° with respect to the front surface FS1 (i.e., greater than about 45° from a line perpendicular to the front surface FS1) of the display apparatus 1. The optical control panel 500 may be arranged in the display area DA. The optical control panel 500 may include a transmissive area, such that light emitted by a light-emitting diode arranged in the display area DA may be transmitted to the outside. The optical control panel 500 may be separately formed and attached to the display panel 10.

The cover window 20 may be disposed over the display panel 10 and the optical control panel 500. In an embodiment, the cover window 20 may be bonded to an element thereunder for example the optical control panel 500, through adhesion using for example an optically clear adhesive (OCA). The cover window 20 may protect the display panel 10 and the optical control panel 500. The cover window 20 may include glass, sapphire, and plastic, or a combination thereof. For example, the cover window 20 may be ultra-thin glass (UTG), colorless polyimide (CPI), or a combination thereof.

Figure 3:
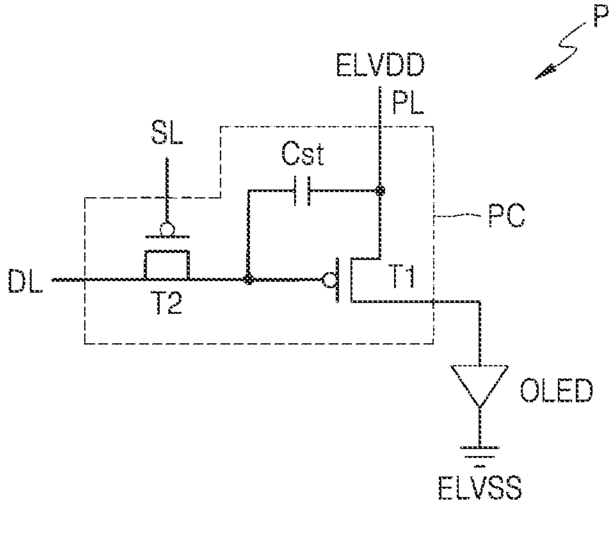
FIG. 3 is schematic diagram of an equivalent circuit of a pixel according to an embodiment.
Figure 4:
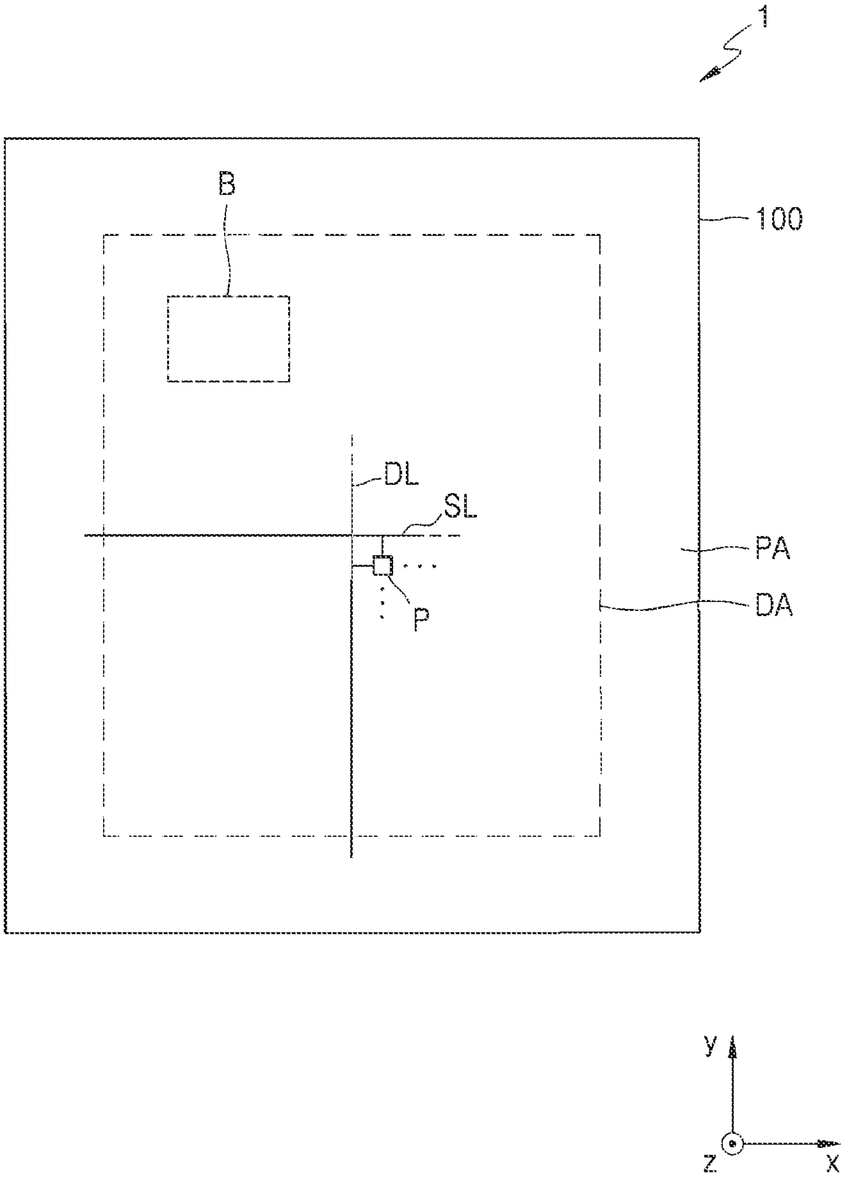
FIG. 4 is a plan view schematically illustrating a display apparatus according to an embodiment.

FIG. 3 is schematic diagram of an equivalent circuit of a pixel P according to an embodiment, and FIG. 4 is a plan view schematically illustrating the display apparatus 1 according to an embodiment.

Referring to FIGS. 3 and 4, the substrate 100 of the display apparatus 1 may be divided into the display area DA and the peripheral area (or non-display area) PA. The display apparatus 1 may provide an image by using light emitted from the plurality of pixels P arranged in the display area DA.

Each of the pixels P may include a display element, such as an organic light-emitting diode OLED or an inorganic light-emitting diode, and may emit for example red, green, blue, or white light. In other words, each of the pixels P may be electrically connected to a pixel circuit PC that includes a thin-film transistor and a storage capacitor Cst. The pixel circuit PC may be electrically connected to a scan line SL, a data line DL crossing the scan line SL, and a driving voltage line PL. In an embodiment, the scan line SL may extend in a first direction (x direction), and each of the data line DL and the driving voltage line PL may extend in a second direction (y direction).

Each of the pixels P may emit light by driving the pixel circuit PC, and the display area DA may provide an image by using the light emitted from the pixels P. The pixel P as described herein may be defined as an emission area in which any one of red, green, blue, and white light may be emitted as described above.

The peripheral area (or non-display area) PA may be an area in which the pixels P may not be arranged and where no image is produced. In the peripheral area PA, an internal driving circuit part for driving the pixels P, a power supply line, and a terminal part to which a printed circuit board or a driver integrated chip (IC) may be electrically connected may be arranged.

An organic light-emitting diode OLED, which may be a display element of the pixel P, may be electrically connected to the pixel circuit PC. For example, the organic light emitting diode OLED may emit one of red, green, and blue light or one of red, green, blue and white light. The pixel circuit PC may include a first thin-film transistor T1, a second thin-film transistor T2, and the storage capacitor Cst.

The second thin-film transistor T2, which may be a switching thin-film transistor, may be electrically connected to the scan line SL and the data line DL and transfer a data voltage received via the data line DL to the first thin-film transistor T1 in response to a switching voltage received via the scan line SL. The storage capacitor Cst may be electrically connected between the second thin-film transistor T2 and the driving voltage line PL and store a voltage corresponding to a difference between a voltage received from the second thin-film transistor T2 and a first power voltage ELVDD applied to the driving voltage line PL.

The first thin-film transistor T1, which may be a driving thin-film transistor, may be electrically connected to the driving voltage line PL and the storage capacitor Cst and control a driving current flowing from the driving voltage line PL to the organic light-emitting diode OLED according to a voltage stored in the storage capacitor Cst. The organic light-emitting diode OLED may emit light having a certain luminance according to the driving current. An opposite electrode (e.g., a cathode) of the organic light-emitting diode OLED may receive a second power voltage ELVSS.

Figure 5:
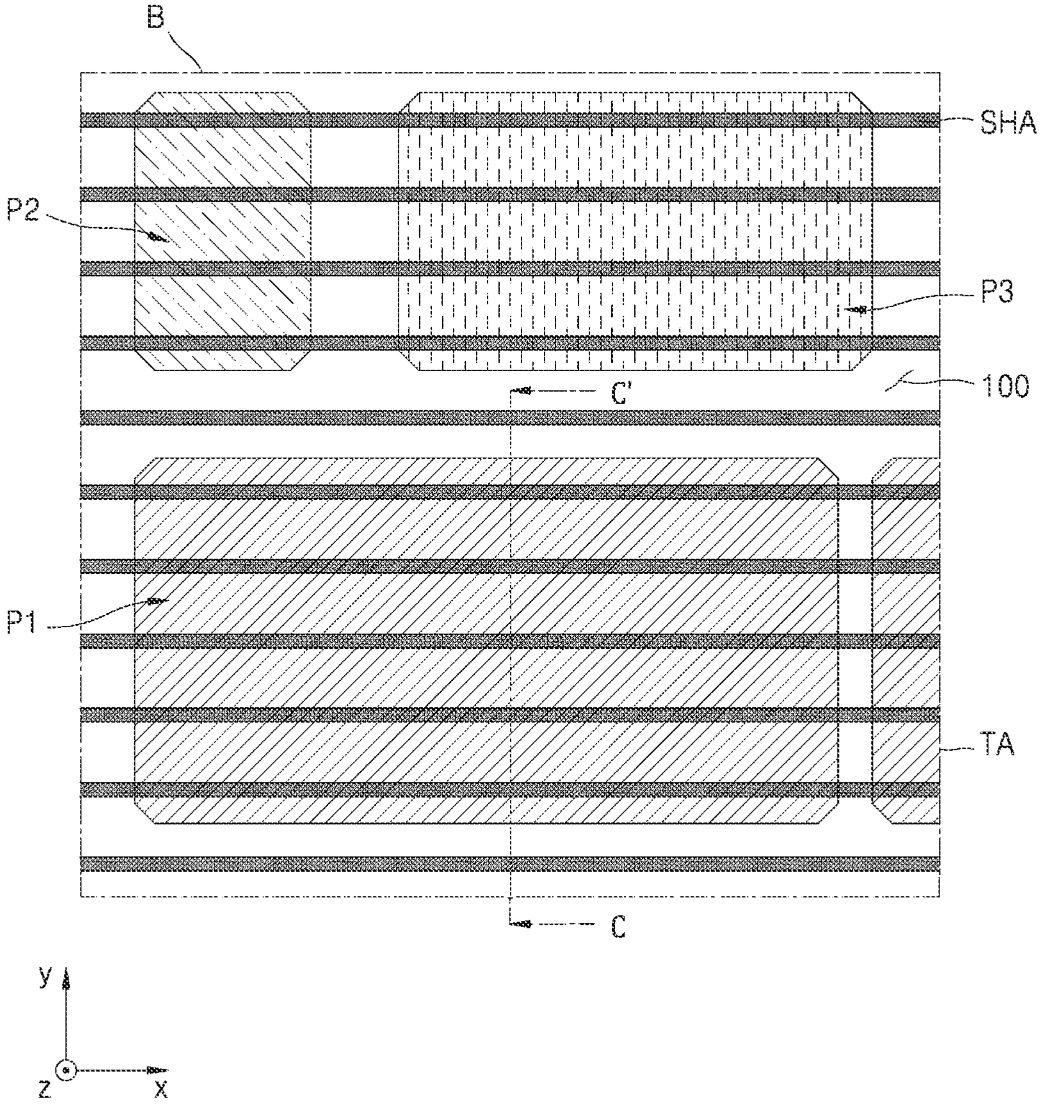
FIG. 5 is an enlarged plan view of region B of the display apparatus shown in FIG. 4.

FIG. 5 is an enlarged plan view of region B of the display apparatus 1 shown in FIG. 4.

Referring to FIG. 5, a first pixel P1, a second pixel P2, and a third pixel P3 may be disposed on the substrate 100. Here, the first pixel P1, the second pixel P2, and the third pixel P3 shown in FIG. 5 may be defined by an emission area of each display element.

The first pixel P1 may emit light of a first wavelength band. For example, the first pixel P1 may emit light of a wavelength in a range of about 450 nm to about 495 nm. The second pixel P2 may emit light of a second wavelength band. For example, the second pixel P2 may emit light of a wavelength in a range of about 630 nm to about 780 nm. The third pixel P3 may emit light of a third wavelength band. For example, the third pixel P3 may emit light of a wavelength in a range of about 495 nm to about 570 nm.

Each of the first pixel P1, the second pixel P2, and the third pixel P3 may have a quadrangular shape from among polygonal shapes. In the disclosure, a polygon, or a quadrangle, may include round edges. In other words, each of the first pixel P1, the second pixel P2, and the third pixel P3 may have a quadrangular shape with round edges. In an embodiment, each of the first pixel P1, the second pixel P2, and the third pixel P3 may have a circular shape or an elliptical shape.

The first pixel P1, the second pixel P2, and the third pixel P3 may differ in size from each other. For example, an area of the second pixel P2 may be less than an area of each of the first pixel P1 and the third pixel P3, and the area of the first pixel P1 may be greater than the area of the third pixel P3. However, the disclosure may not be limited thereto. Sizes of the first pixel P1, the second pixel P2, and the third pixel P3 may be substantially equal, and various modifications may be made.

The first pixel P1 may be provided in multiple, and the first pixels P1 may be spaced-apart from each other and arranged in the first direction (x direction). Each of the second pixel P2 and the third pixel P3 may be provided in multiple, and the second pixels P2 and the third pixels P3 may be spaced-apart from each other and be repeatedly arranged in the first direction (x direction). A pixel row including the plurality of first pixels P1 arranged in the first direction (x direction) and a pixel row including the second pixels P2 and the third pixels P3 alternately arranged in the first direction (x direction) may be spaced-apart from each other and repeatedly arranged in the second direction (y direction). However, the disclosure may not be limited thereto, and the first pixel P1, the second pixel P2, and the third pixel P3 may instead be arranged in various other pixel arrangement structures, such as a PenTile™ structure, a stripe structure, a mosaic structure, or a delta structure.

The substrate 100 may include a light-shielding area SHA which reflects or absorbs light emitted from the first pixel P1, the second pixel P2, and the third pixel P3. The substrate 100 may also include a transmissive area TA. The light-shielding area SHA may be an area in which a light-shielding wall absorbing light may be disposed, and may extend in the first direction (x direction) and overlap or cover the plurality of pixels in a plan view. The light-shielding area SHA may be provided in a multiple, and the light-shielding areas SHA may be spaced-apart from each other and arranged in the second direction (y direction). An area between neighboring light-shielding areas SHA may be defined as the transmissive area TA. As shown in FIG. 5, a single pixel may overlap or cover in a plan view the multiple light-shielding areas SHA and the multiple transmissive areas TA.

The plurality of light-shielding areas SHA may limit a specific direction component of light emitted from the first pixel P1, the second pixel P2, and the third pixel P3. For example, in case that a second-direction (y direction) component of the light emitted from the first pixel P1, the second pixel P2, and the third pixel P3 exceeds a certain value and has an emission angle greater than a cut-off angle, the emitted light may be blocked by the light-shielding area SHA.

Figure 6:
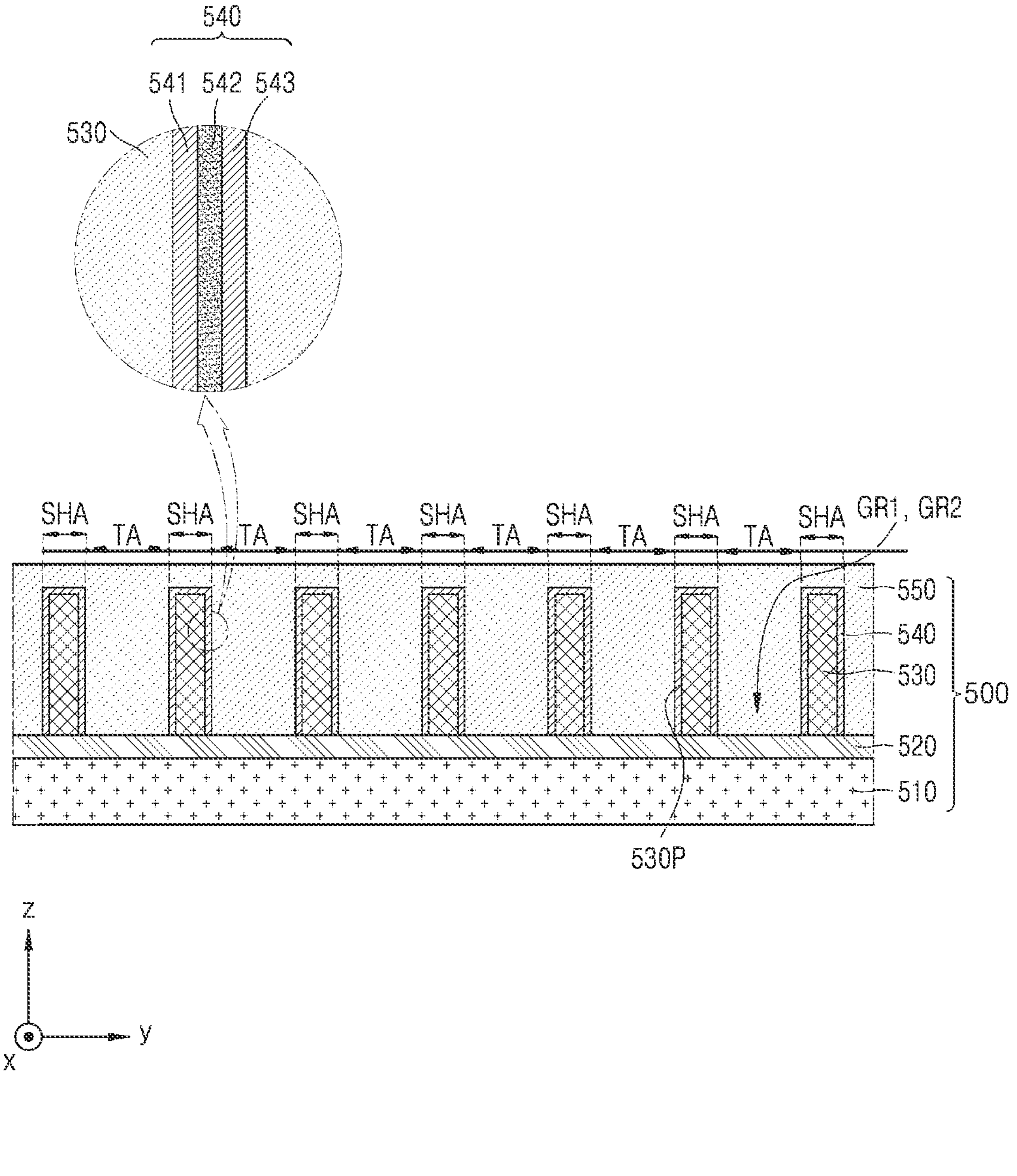
FIG. 6 is a schematic cross-sectional view of the optical control panel portion of the display apparatus of FIG. 4 taken along line C-C' of FIG. 5.

FIG. 6 is a schematic cross-sectional view of the optical control portion 500 of the display apparatus 1 taken along line C-C' of FIG. 5.

Referring to FIG. 6, the optical control panel 500 according to an embodiment may include a base film 510, a first transmissive layer 520, a first organic layer 530, a first light-shielding layer 540, and a second transmissive layer 550.

The base film 510 may serve as a lower substrate for forming the optical control panel 500 and serves to prevent a surface of the optical control panel 500 from being damaged during a manufacturing process.

The base film 510 may include polymer resin, such as polyimide (PI). For example, the base film 510 may include polyethylene terephthalate (PET), poly(butylene terephthalate) (PBT), polyethylene naphthalene (PEN), polycarbonate (PC), poly(methylmethacrylate) (PMMA), polystyrene (PS), polyvinylchloride (PVC), polyethersulfone (PES), polypropylene (PP), polyamide (PA), modified polyphenylene ether (m-PPO), polyoxymethylene (POM), polysulfone (PSU), polyphenylene sulfide (PPS), PI, polyethyleneimine (PEI), polyether ether ketone (PEEK), polyamide imide (PAI), polyarylate (PAR), thermoplastic polyurethane (TPU), or a combination thereof.

However, the base film 510 may be temporarily attached to the optical control panel 500 during a manufacturing process of the optical control panel 500 and be detached from the optical control panel 500 in a completed display apparatus 1. In earlier art, a process of forming (e.g., directly forming) an optical control panel on a display panel may be performed. In earlier art, in order to protect a pixel circuit and light-emitting diodes included in the display panel, the optical control panel cannot be formed in a high temperature environment. In earlier art, because it may be necessary to form an organic layer included in the optical control panel at low temperatures, organic layer outgassing may not be sufficiently performed, and thus in earlier art, there may be a reliability and quality problem as a result of the low temperature process. On the other hand, in the optical control panel 500 according to an embodiment, because a manufacturing process of optical control panel 500 may be performed separately from the display panel 10, not only may the organic layer process be performed in the high temperature environment, but also heat treatment processes to be described later may be performed together. In other words, by forming the optical control panel 500 on the base film 510 and separating the base film 510 before the optical control panel 500 is attached to the display panel 10, reliability of the optical control panel 500 produced at high temperatures may be achieved without damaging the display panel 10 by subjecting the display panel 10 to high temperatures.

In an embodiment, the first transmissive layer 520 may be disposed on the base film 510. The first transmissive layer 520 may include a transparent conductive oxide. For example, the first transmissive layer 520 may include amorphous indium tin oxide (a-ITO) or polycrystalline indium tin oxide (p-ITO). For example, a-ITO included in the first transmissive layer 520 may become p-ITO through a crystallization process after deposition. In an embodiment, the first transmissive layer 520 may be formed through a process of depositing a-ITO on the base film 510 followed by crystallizing the a-ITO into p-ITO through a heat treatment process. The heat treatment process may be performed at a temperature of at least about 200° C. for about 20 minutes to about 30 minutes.

The p-ITO has a weak bonding force with copper (Cu) or a copper oxide ($CuO_x$), which may be included in the first light-shielding layer 540 to be described later. Accordingly, a portion of the first light-shielding layer 540 in physical contact with the first transmissive layer 520 crystallized into p-ITO may be readily lifted off and removed. In other words, by designing the first transmissive layer 520 to include the p-ITO, the first light-shielding layer 540 arranged in the transmissive area TA may be readily removed without an additional etching process, thereby simplifying the manufacturing process and reducing the processing time.

The first organic layer 530 including a plurality of first organic patterns 530P may be disposed on the first transmissive layer 520. The first organic layer 530 may include multiple first organic patterns 530P that extend in the first direction (x direction). The first organic patterns 530P that constitute the first organic layer 530 includes a plurality of first grooves GR1. The plurality of first grooves GR1 included in the first organic layer 530 may expose a portion of a layer thereunder, for example, the first transmissive layer 520. For example, the plurality of first grooves GR1 may be bounded by sidewalls of neighboring first organic patterns 530P, and an exposed portion of the upper surface of the first transmissive layer 520 abuts the sidewalls of the first organic patterns 530P. The sidewalls of the first organic patterns 530P may be perpendicular to the upper surface of the first transmissive layer 520. In another embodiment, the first organic patterns 530P may have a reverse tapered shape. The first organic patterns 530P may be arranged spaced-apart from each other in the second direction (y direction).

The first organic layer 530 may include a transmissive organic material. In an embodiment, the first organic layer 530 may include an acryl-based resin (e.g., PMMA, polyacrylic acid, etc.), ethylhexyl acrylate, pentafluoropropyl acrylate, poly(ethylene glycol) dimethacrylate, ethylene glycol dimethacrylate, or a combination thereof.

The first light-shielding layer 540 may be formed on the first organic layer 530. For example, the first light-shielding layer 540 may be formed on the upper surface and the side surfaces of the first organic patterns 530P, so as to surround the first organic patterns 530P of the first organic layer 530. However, the first light-shielding layer 540 may not be limited thereto, and the first light-shielding layer 540 may instead be formed to cover only the side surfaces of the first organic patterns 530P. Accordingly, an area in which the first light-shielding layer 540 coats the first organic patterns 530P may constitute the light-shielding areas SHA, and the remaining area may be the transmissive areas TA.

The first light-shielding layer 540 may include second grooves GR2. The second grooves GR2 of the first light-shielding layer 540 may overlap or correspond to the first grooves GR1 of the first organic layer 530 in a plan view, and second grooves GR2 may correspond to places where first light-shielding layer 540 may be absent. Accordingly, the second grooves GR2 of the first light-shielding layer 540 may expose a portion of a layer thereunder, for example, the first transmissive layer 520. For example, the second grooves GR2 may be bounded by the first light-shielding layer 540 formed on the sidewalls of the neighboring first organic patterns 530P, and the exposed portion of the upper surface of the first transmissive layer 520.

The first light-shielding layer 540 may include a light absorption material so as to absorb light having at least a certain emission angle from among light emitted from the display element layer 220 (see FIG. 2). To achieve this, the first light-shielding layer 540 may include a metal oxide. In an embodiment, the first light-shielding layer 540 may include a metal layer including a first metal element, and a metal oxide layer including an oxide of the first metal element. The first metal element may be Cu, molybdenum (Mo), or a combination thereof, and the oxide of the first metal element may be $CuO_x$, molybdenum oxide ($MoO_x$), or a combination thereof. Each of $CuO_x$ and $MoO_x$ has a blackening property and thus has a large light absorption coefficient.

In case that the first light-shielding layer 540 includes a single layer, the first light-shielding layer 540 may include $CuO_x$, or $MoO_x$, or a combination thereof. However, in case that the first light-shielding layer 540 includes multiple layers, the first light-shielding layer 540 may include a first layer 541 (or a first metal oxide layer) surrounding the first organic patterns 530P, a second layer 542 (or a first metal layer) surrounding the first layer 541, and a third layer 543 (or a second metal oxide layer) surrounding the second layer 542. The second layer 542 may include the first metal element, and the first layer 541 and the third layer 543 may each include the oxide of the first metal element. For example, the first layer 541 and the third layer 543 may include $CuO_x$, $MoO_x$, or a combination thereof, and the second layer 542 may include Cu, Mo, or a combination thereof.

In an embodiment, after Cu may be deposited on the first transmissive layer 520 and on the first organic layer 530, the copper may be oxidized to produce $CuO_x$ through a heat treatment process. The heat treatment process may be performed at a temperature of at least about 200° C. for about 20 minutes to about 30 minutes in an oxygen ($O_2$) atmosphere. During the heat treatment process, $CuO_x$ starts to simultaneously form from both an interface between the first organic patterns 530P and the first light-shielding layer 540 and from an outer surface of the first light-shielding layer 540. Accordingly, after the heat treatment process is performed, the first light-shielding layer 540 may be formed as a multi-layer structure including the first layer 541 including $CuO_x$, the second layer 542 including Cu, and the third layer 543 including $CuO_x$. This process may also be equally applied in case that the first metal element may be Mo.

In case that a metal layer, such as a Cu layer or a Mo layer, is deposited on the first organic patterns 530P, due to limitation of a sputtering technique, a thickness of a metal layer deposited along the sidewalls of the first organic patterns 530P may be non-uniform. However, in case that the metal oxide layer is formed through a heat treatment technique, an oxidization rate may be constant regardless of a vertical position on the sidewalls of the first organic patterns 530P. Accordingly, a thickness of the second layer 542 that may be a metal layer arranged between the first layer 541 and the third layer 543 may be non-uniform, but a thickness of each of the first layer 541 and the third layer 543 that may be metal oxide layers may be substantially uniform. Consequently, because a thickness of the metal oxide layer performing a light absorption function may be uniform, a step coverage problem due to a step difference occurring from a limitation in the sputtering technique in the earlier art may be overcome.

The second transmissive layer 550 may be disposed over the first transmissive layer 520 and the first light-shielding layer 540. The second transmissive layer 550 may fill the grooves GR1 and GR2 arranged between the first organic patterns 530P corresponding to the transmissive areas TA. The second transmissive layer 550 may fill the grooves GR1 and GR2 and have a flat upper surface.

The second transmissive layer 550 may include an acryl-based resin (e.g., PMMA, polyacrylic acid, etc.), ethylhexyl acrylate, pentafluoropropyl acrylate, poly(ethylene glycol) dimethacrylate, ethylene glycol dimethacrylate, or a combination thereof. The second transmissive layer 550 and the first organic layer 530 may include a same material.

FIGS. 7A to 7F are schematic cross-sectional views sequentially illustrating some operations of a method of manufacturing the optical control panel 500 according to an embodiment.

Figure 7A:
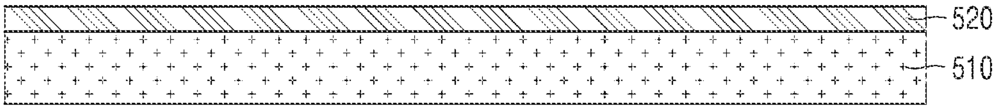
FIGS. 7A to 7F are schematic cross-sectional views illustrating intermediate steps of a method of manufacturing an optical control panel according to an embodiment.

Turning now to FIG. 7A, the first transmissive layer 520 may be formed on the base film 510. To form the first transmissive layer 520, a-ITO may initially be deposited on the base film 510. The a-ITO may become p-ITO through a crystallization process, such as a heat treatment process. The heat treatment process may be performed at a temperature of at least about 200° C. for a duration of about 20 minutes to about 30 minutes. As a result, through such a deposition and heat treatment process, the first transmissive layer 520 may include p-ITO.

Figure 7B:
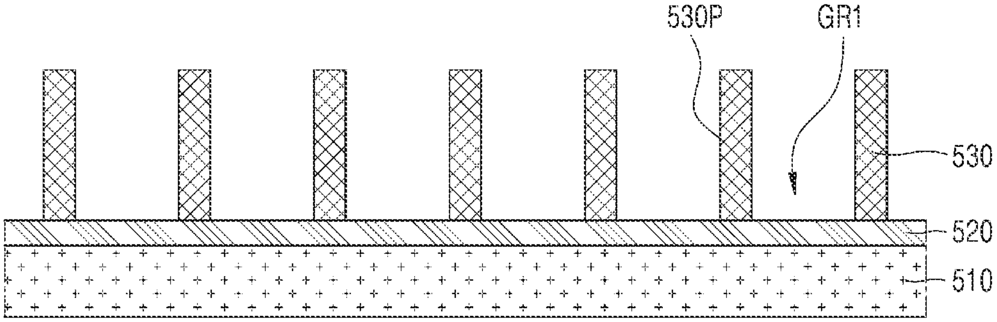

Turning now to FIG. 7B, the first organic layer 530 that includes multiple first organic patterns 530P extending in the first direction (x direction) may be formed on the first transmissive layer 520. As described above, the first organic patterns 530P may be formed as the first organic layer 530 includes the first grooves GR1. The first grooves GR1 may expose part of the first transmissive layer 520 that may be a layer thereunder. The first organic layer 530 may be patterned through a photolithography process after a transmissive organic material is applied.

Figure 7C:
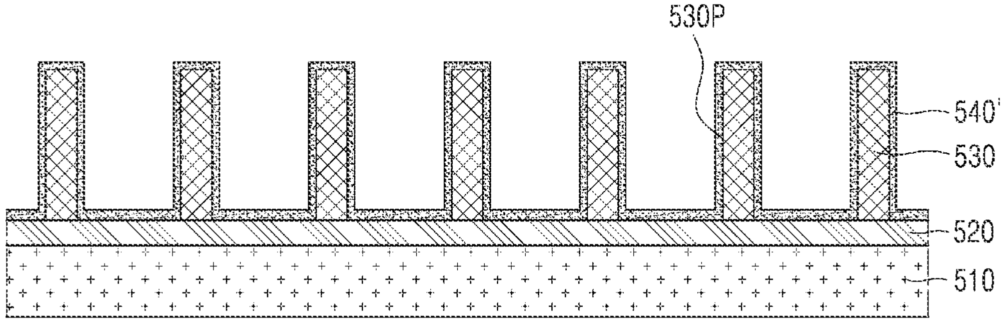

Turning now to FIG. 7C, a metal layer 540' may be formed on exposed portions of the first transmissive layer 520 and on the first organic layer 530. The metal layer 540' may include a first metal element, which may be Cu, Mo, or a combination thereof. The metal layer 540' may be deposited by a sputtering technique, but a thickness thereof may be non-uniform due to a step difference, similar to the f first organic patterns 530P.' Specifically, a portion of metal layer 540' corresponding to an upper portion of first organic patterns 530P may have a greater thickness than a lower portion.

Figure 7D:
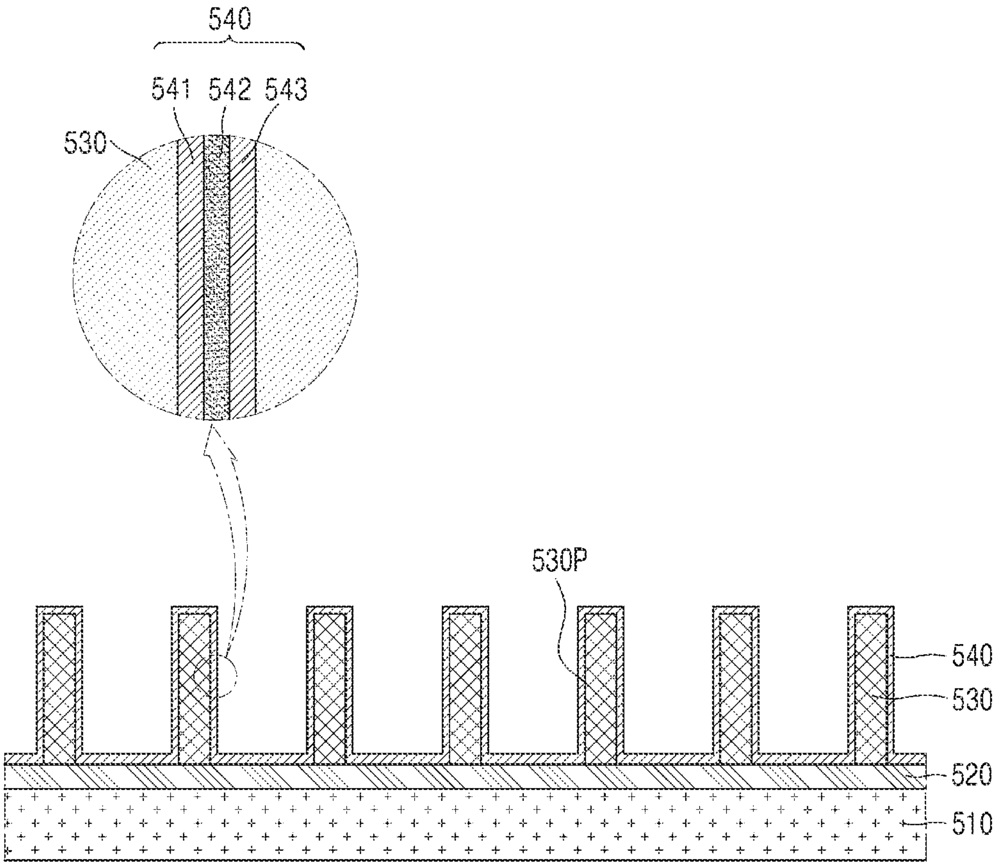

Turning now to FIG. 7D, the first light-shielding layer 540 may be produced upon a heat treatment process being performed on the metal layer 540'. The heat treatment process may be performed at a temperature of at least about 200° C. for a duration of about 20 minutes to about 30 minutes in an $O_2$ atmosphere. As a result of the heat treatment process, a metal oxide layer may be formed from an interface between the first organic patterns 530P and the first light-shielding layer 540 and from an external surface of the first light-shielding layer 540. In other words, after the heat treatment process, the first light-shielding layer 540 may include the first layer 541 including a metal oxide material, the second layer 542 on which oxidation has not occurred, and the third layer 543 including the metal oxide material. In an embodiment, each of the first layer 541 and the third layer 543 may include $CuO_x$, $MoO_x$, or a combination thereof, and the second layer 542 may include Cu, Mo, or a combination thereof.

The metal layer 540' in FIG. 7C may be deposited with a non-uniform thickness, but a thickness of each of the first layer 541 and the third layer 543 that may be metal oxide layers may be substantially uniform. This is because an oxidization rate may be constant regardless of a vertical position with respect to the sidewalls of the first organic patterns 530P.

Figure 7E:
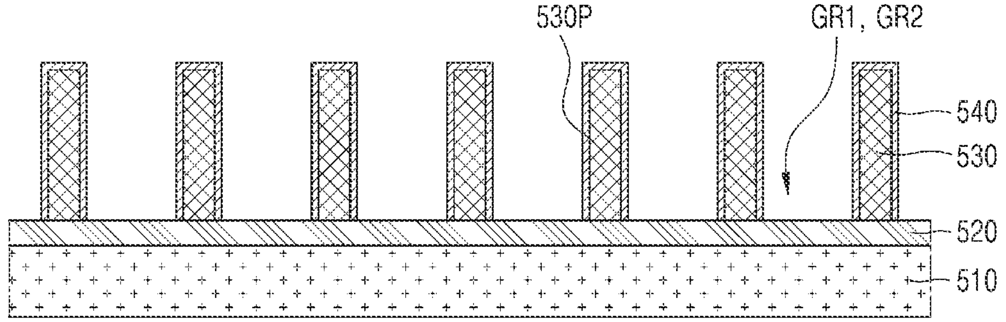

Turning now to FIG. 7E, the second grooves GR2 may be formed in the first light-shielding layer 540. The second grooves GR2 may overlap or correspond to the first grooves GR1 in a plan view. Accordingly, the plurality of second grooves GR2 of the first light-shielding layer 540 may expose part of the first light-transmissive layer 520 that may be a layer thereunder, and form the transmissive area TA. In the earlier art, in order to form multiple grooves in a light-shielding layer 540, it is necessary to perform an etching process. However, in the optical control panel 500 according to an embodiment, the first transmissive layer 520 may include p-ITO, and the first light-shielding layer 540 may include Cu, $CuO_x$, or a combination thereof. Because p-ITO has a weak bonding force with Cu and $CuO_x$, a portion of the first light-shielding layer 540 in physical contact with the first transmissive layer 520 may readily be lifted off and readily removed without requiring an etching process.

Figure 7F:
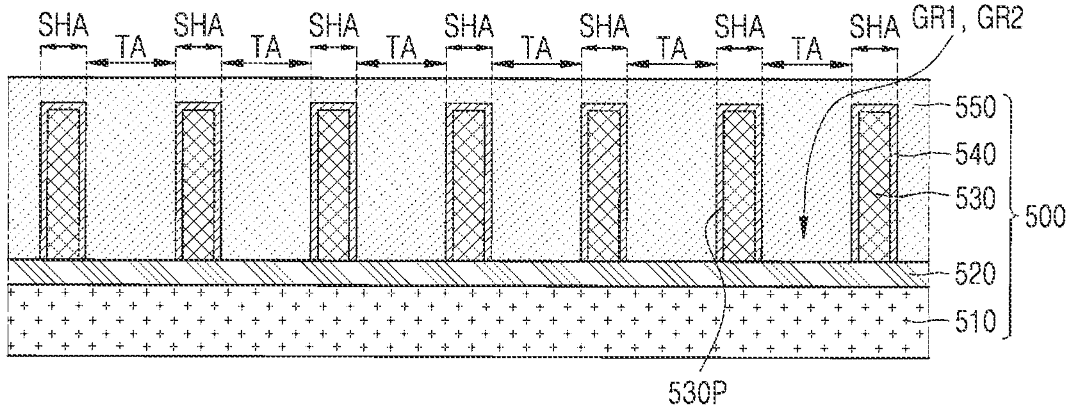

Turning now to FIG. 7F, the second transmissive layer 550 may be formed on the first transmissive layer 520 and the first light-shielding layer 540. The second transmissive layer 550 may fill the grooves GR1 and GR2 and have a flat upper surface. As described above, the optical control panel 500 according to an embodiment may be manufactured separately from the display panel 10. By doing so, a highly reliable optical control panel 500 made using a high temperature process while not subjecting the display panel 10 to said high temperatures is achieved.

Figure 8:
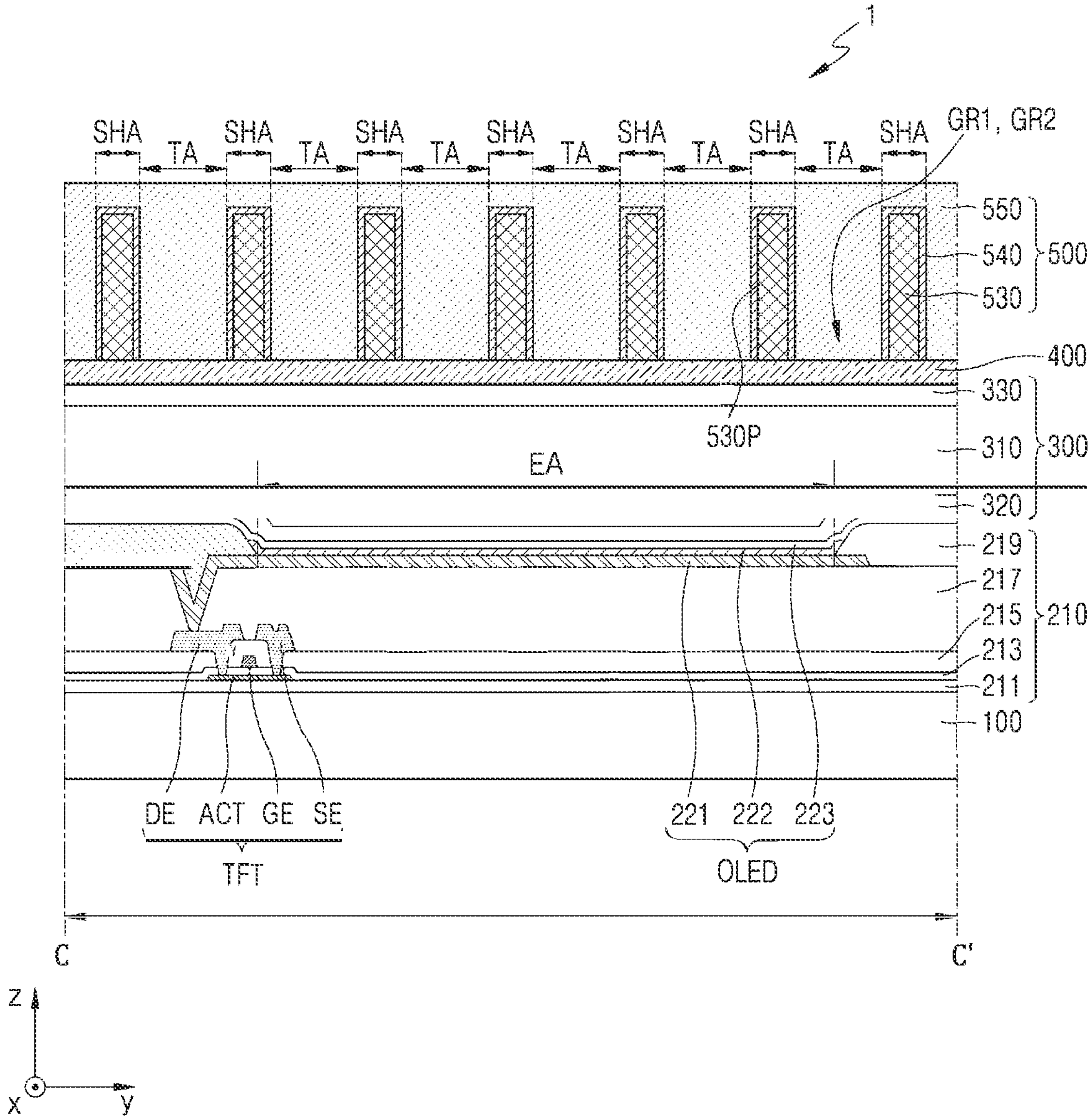
FIG. 8 is a schematic cross-sectional view of a display apparatus according to an embodiment.

FIG. 8 is a schematic cross-sectional view of a display apparatus 1 according to an embodiment. With regard to elements in FIG. 8, descriptions of elements having same reference numerals as those of FIG. 6 may be applicable to those same elements in FIG. 8, and only differences therebetween will be described below.

Referring to FIG. 8, the display apparatus 1 according to an embodiment may include the substrate 100, the pixel circuit layer 210, the organic light-emitting diode OLED, the encapsulation layer 300, the touch sensor layer 400, and the optical control panel 500.

As described above, the substrate 100 may include a glass material or polymer resin. The pixel circuit layer 210 may be disposed on the substrate 100.

The pixel circuit layer 210 may include a thin-film transistor TFT and a storage capacitor (not shown). The thin-film transistor TFT may include a semiconductor layer ACT, a gate electrode GE, a source electrode SE, and a drain electrode DE, the semiconductor layer ACT including amorphous silicon, polycrystalline silicon, or an organic semiconductor material. To ensure insulation between the semiconductor layer ACT and the gate electrode GE, a gate insulating layer 213 including an inorganic material, such as $SiO_x$, $SiN_x$, SiON, or a combination thereof may be disposed between the semiconductor layer ACT and the gate electrode GE.

An interlayer insulating layer 215 including an inorganic material, such as $SiO_x$, $SiN_x$, SiON, or a combination thereof may be disposed on the gate electrode GE, and the source electrode SE and the drain electrode DE may be disposed on the interlayer insulating layer 215 described above. The interlayer insulating layer 215 may be formed by a chemical vapor deposition (CVD) technique or an atomic layer deposition (ALD) technique. In an embodiment, any of the source electrode SE and the drain electrode DE may be omitted and replaced with the semiconductor layer ACT that is conductive.

The gate electrode GE, the source electrode SE, and the drain electrode DE may include various conductive materials. The gate electrode GE may include Mo, aluminum (Al), Cu, titanium (Ti), or a combination thereof, and when necessary, may have a multi-layer structure. For example, the gate electrode GE may include a single Mo layer or may have a three-layer structure including a Mo layer, an Al layer, and another Mo layer. Each of the source electrode SE and the drain electrode DE may include Cu, Ti, Al, or a combination thereof, and when necessary, may include a multi-layer structure. For example, each of the source electrode SE and the drain electrode DE may have a three-layer structure including a Ti layer, an Al layer, and another Ti layer.

A buffer layer 211 including an inorganic material, such as $SiO_x$, $SiN_x$, SiON, or a combination thereof may be disposed between the thin-film transistor TFT and the substrate 100. The buffer layer 211 may increase flatness of an upper surface of the substrate 100 and prevents or minimizes permeation of impurities from the substrate 100 or the like into the semiconductor layer ACT of the thin-film transistor TFT.

A planarization insulating layer 217 may be disposed on the thin-film transistor TFT. The planarization insulating layer 217 may include an organic material, such as acrylic, benzocyclobutene (BCB), hexamethyldisiloxane (HMDSO), or a combination thereof. In FIG. 6, the planarization insulating layer 217 includes a single layer however the planarization insulating layer 217 may instead include multiple layers.

A pixel electrode 221 may be disposed on the planarization insulating layer 217. The pixel electrode 221 may be arranged for each pixel. The pixel electrodes 221 respectively corresponding to neighboring pixels may be arranged so that they are spaced-apart from each other.

The pixel electrode 221 may be a reflective electrode. In some embodiments, the pixel electrode 221 may include a reflective layer and a transparent or semi-transparent electrode layer on the reflective layer, the reflective layer including silver (Ag), magnesium (Mg), Al, platinum (Pt), palladium (Pd), gold (Au), nickel (Ni), neodymium (Nd), iridium (Jr), chrome (Cr), a combination thereof, or any compounds thereof. The transparent or semi-transparent electrode layer may include indium tin oxide (ITO), indium zinc oxide (IZO), ZnO, indium oxide ($In_2O_3$), indium gallium oxide (IGO), aluminum zinc oxide (AZO), or a combination thereof. In some embodiments, the pixel electrode 221 may have a three-layer structure of an ITO layer, an Ag layer, and another ITO layer.

A pixel-defining layer 219 may be disposed on the pixel electrode 221. The pixel-defining layer 219 may include an opening exposing an upper surface of the pixel electrode 221. The opening of the pixel-defining layer 219 may define an emission area EA of the pixel. The pixel-defining layer 219 may cover an edge of the pixel electrode 221 and increase a distance between the edge of the pixel electrode 221 and an opposite electrode 223, thereby preventing an arc or the like from occurring at the edge of the pixel electrode 221. The pixel-defining layer 219 may include an organic insulating material, such as PI, PA, acrylic resin, BCB, HMDSO, phenolic resin, or a combination thereof, and may be formed by spin coating or the like. As another example, the pixel-defining layer 219 may include an inorganic insulating material. As another example, the pixel-defining layer 219 may have a multi-layer structure including an inorganic insulating material and an organic insulating material.

In some embodiments, the pixel-defining layer 219 may include a light-shielding material and be provided in black. The light-shielding layer may include a resin or paste including carbon black, carbon nanotubes, or black dye, metal particles, such as Ni, Al, Mo, alloys thereof, metal oxide particles (e.g., a chrome oxide), metal nitride particles (e.g., a chrome nitride), or a combination thereof.

An emission layer 222 may be disposed on the pixel electrode 221. The emission layer 222 may include an organic material including a fluorescent or phosphorous material capable of emitting red, green, or blue light. The organic material described above may be a low-molecular weight organic material or a polymer organic material. The emission layer 222 may be arranged to correspond to the pixel electrode 221.

A first common layer (not shown) and/or a second common layer (not shown) may be disposed under and over the emission layer 222 in a plan view. The first common layer may be disposed under the emission layer 222 and may include for example a hole transport layer (HTL), or the HTL and a hole injection layer (HIL). The second common layer may be disposed over the emission layer 222 in a plan view and may include an electron transport layer (ETL) and/or an electron injection layer (EIL). In some embodiments, the second common layer may not be provided.

Similar to the opposite electrode 223 to be described below, the first common layer and the second common layer may be common layers that are integral with each other as a single body to entirely cover the display area DA of the substrate 100.

The opposite electrode 223 may be a cathode that may be an electron injection electrode, and materials for the opposite electrode 223 may include a metal having a low work function, an alloy, an electrically conductive compound, or any combinations thereof. The opposite electrode 223 may be a transmissive electrode, a semi-transmissive electrode, or a reflective electrode.

The opposite electrode 223 may include Li, Ag, Mg, Al, Al—Li, calcium (Ca), Mg—In, Mg—Ag, ytterbium (Yb), Ag—Yb, ITO, IZO, or any combinations thereof. The opposite electrode 223 may have a single layer or multiple layers.

A capping layer (not shown) may further be disposed over the opposite electrode 223. The capping layer may improve external emission efficiency of an organic light-emitting diode OLED according to the principle of constructive interference. The capping layer may include a material having a refractive index (at about 589 nm) of about 1.6 or more. A thickness of the capping layer may be about 1 nm to about 200 nm, for example, about 5 nm to about 150 nm, or for example, about 10 nm to about 100 nm. The capping layer may be an organic capping layer including an organic material, an inorganic capping layer including an inorganic material, or a composite capping layer including an organic material and an inorganic material.

The encapsulation layer 300 for sealing a display element may be disposed on the organic light-emitting diode OLED. The encapsulation layer 300 may include at least one inorganic encapsulation layer and at least one organic encapsulation layer. The at least one inorganic encapsulation layer may include inorganic materials from among $Al_2O_3$, $TiO_2$, $Ta_2O_5$, ZnO, $SiO_2$, $SiN_x$, SiON, or a combination thereof. The at least one organic encapsulation layer may include a polymer-based material, an acrylate or a combination thereof. The polymer-based material may include an acryl-based resin, an epoxy-based resin, PI, polyethylene, or a combination thereof. In FIG. 8, the encapsulation layer 300 includes a first inorganic encapsulation layer 310, a second inorganic encapsulation layer 330, and an organic encapsulation layer 320 disposed between the first inorganic encapsulation layer 310 and the second inorganic encapsulation layer 330. The organic encapsulation layer 320 may cover a concavo-convex surface of the organic light-emitting diode OLED and provide a flat upper surface.

The touch sensor layer 400 may be disposed on the encapsulation layer 300. The touch sensor layer 400 may electrically or physically detect a touch input of a user and transfer the touch input as an electrical signal to display layer 200. In an embodiment, the touch sensor layer 400 may be formed (e.g., directly formed) on the encapsulation layer 300. In other words, the touch sensor layer 400 may include sensing patterns and an insulating layer (e.g., directly formed) on the encapsulation layer 300.

The optical control panel 500 may be attached onto the touch sensor layer 400. Although not shown in FIG. 8, the optical control panel 500 may be attached by using an adhesive or the like. However, the optical control panel 500 attached onto the touch sensor layer 400 may not include the base film 510 or the first transmissive layer 520 of FIG. 6. As described above, the base film 510 may not be included in the final display apparatus 1 because the base film 510 may be temporarily attached to manufacture the optical control panel 500, and the first transmissive layer 520 may be removed together with the base film 510 in a detachment process of the base film 510 prior to attachment of optical control panel 500 to the display. However, the disclosure may not be limited thereto, and the first transmissive layer 520 may instead be included in the optical control panel 500 and attached onto the touch sensor layer 400.

Figure 9:
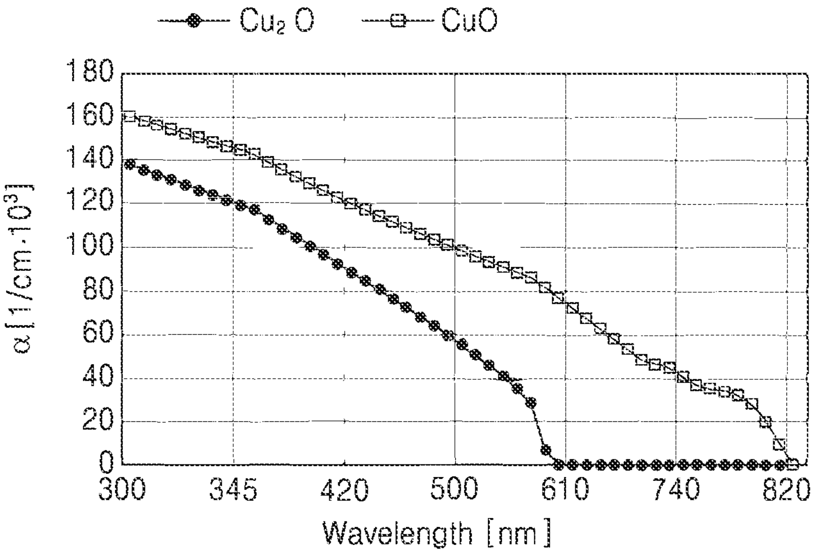
FIG. 9 is a graph showing light absorption coefficients according to wavelength for different materials that constitute a light absorption layer.

FIG. 9 is a graph showing a light absorption coefficient according to wavelength of a light absorption layer.

FIG. 9 is a graph showing a light absorption coefficient $\alpha$ in case that light of different wavelengths may be irradiated onto each of CuO and copper (I) oxide ($Cu_2O$), which may be types of $CuO_x$. A unit of the horizontal axis of the graph may be a unit of wavelength, which may be nm. A unit of the vertical axis of the graph may be a value obtained by multiplying a light absorption coefficient by $10^3$, which may be a ($10^3$/cm).

Referring to FIG. 9, both CuO and $Cu_2O$ have large light absorption coefficient values at about 300 nm to about 550 nm. For example, at about a 380 nm level, $Cu_2O$ has a value of about 100α, and CuO has a value of about 130α. At about a 500 nm level, it may be identified that $Cu_2O$ has a value of about 60α, and CuO has a value of about 100α. In other words, in a wavelength range of blue light, about 450 nm to about 490 nm, it may be concluded that both CuO and $Cu_2O$ have large light absorption coefficients.

Accordingly, even in case that a metal oxide included in the display apparatus according to an embodiment includes $CuO_x$, light may be sufficiently absorbed due to the blackening property of $CuO_x$. In other words, in case that light emitted from the organic light-emitting diode has at least a certain emission angle, because light may be absorbed by $CuO_x$ included in the first light-shielding layer 540 (see FIG. 6), a viewing angle may be limited and reflection off of a vehicle window may be reduced.

In the display apparatus according to an embodiment configured as described above, a viewing angle may be limited in a direction, so that reflection off of a vehicle window may be reduced, and reliability may be ensured with a high temperature processes. However, the one or more embodiments may be only examples, and the scope of the disclosure may not be limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An optical control panel comprising:

a base film;

a first transmissive layer disposed on the base film;

a first organic layer disposed on the first transmissive layer, the first organic layer comprising a plurality of first organic patterns that extend in a first direction; and a first light-shielding layer disposed on an upper surface and on side surfaces of the plurality of first organic patterns, wherein the first light-shielding layer comprises a plurality of grooves exposing at least a part of an upper surface of the first transmissive layer.

2. The optical control panel of claim 1, wherein ones of the plurality of first organic patterns are spaced-apart from each other by certain intervals in a second direction intersecting the first direction.

3. The optical control panel of claim 1, further comprising:

a second transmissive layer disposed on the first light-shielding layer and filling the plurality of grooves, wherein the second transmissive layer comprises a transmissive organic material.

4. The optical control panel of claim 1, wherein the first light-shielding layer comprises a metal oxide.

5. The optical control panel of claim 4, wherein the first light-shielding layer comprises:

a first layer surrounding ones of the plurality of first organic patterns;

a second layer surrounding the first layer; and a third layer surrounding the second layer, wherein the second layer comprises a first metal element, and each of the first layer and the third layer comprises an oxide of the first metal element.

6. The optical control panel of claim 5, wherein the first metal element comprises a material selected from a group consisting of copper (Cu) molybdenum (Mo), and a combination thereof, and the oxide of the first metal element comprises a material selected from a group consisting of copper oxide ($CuO_x$), molybdenum oxide ($MoO_x$), and a combination thereof.

7. The optical control panel of claim 5, wherein a thickness of each of the first layer and the third layer is substantially uniform.

8. The optical control panel of claim 1, wherein the base film comprises polyimide (PI).

9. The optical control panel of claim 1, wherein the first transmissive layer comprises a material selected from a group consisting of amorphous indium tin oxide (a-ITO) polycrystalline indium tin oxide (p-ITO), and a combination thereof.

10. A display apparatus comprising:

a display area and a non-display area;

a display layer disposed on a substrate in the display area and comprising a pixel circuit and a light-emitting diode;

an encapsulation layer disposed on the display layer; and an optical control panel disposed on the encapsulation layer, wherein the optical control panel comprises:

a first organic layer disposed on the encapsulation layer, the first organic layer comprising a plurality of first organic patterns that extend in a first direction; and a first light-shielding layer disposed on an upper surface and on side surfaces of the plurality of first organic patterns in a cross-sectional view, the first light-shielding layer comprising a metal layer and a metal oxide layer, the metal layer including a first metal element, the metal oxide layer including an oxide of the first metal element.

11. The display apparatus of claim 10, wherein the first metal element comprises a metal selected from a group consisting of copper (Cu), molybdenum (Mo), and a combination thereof, and the oxide of the first metal element comprises a material selected from a group consisting of a copper oxide ($CuO_x$), a molybdenum oxide ($MoO_x$), and a combination thereof.

12. The display apparatus of claim 10, wherein the optical control panel further comprises a first transmissive layer disposed under the first organic layer in a plan view, and the first transmissive layer comprises a material selected from a group consisting of amorphous indium tin oxide (a-ITO), polycrystalline indium tin oxide (p-ITO), and a combination thereof.

13. The display apparatus of claim 10, further comprising:

a touch sensor layer disposed between the encapsulation layer and the optical control panel.

14. The display apparatus of claim 10, further comprising:

a second transmissive layer disposed in an area between neighboring ones of the plurality of first organic patterns, wherein the second transmissive layer comprises a transmissive organic material.

15. The display apparatus of claim 10, wherein the metal layer comprises a first metal layer, the metal oxide layer comprises a first metal oxide layer and a second metal oxide layer, the first metal oxide layer surrounds ones of the plurality of first organic patterns, the first metal layer surrounds the first metal oxide layer, the second metal oxide layer surrounds the first metal layer, the first metal oxide layer and the second metal oxide layer each comprise a material selected from a group consisting of a copper oxide ($CuO_x$), a molybdenum oxide ($MoO_x$), and a combination thereof, and the first metal layer comprises a material selected from a group consisting of copper, (Cu) molybdenum (Mo), and a combination thereof.

16. The display apparatus of claim 15, wherein a thickness of each of the first metal oxide layer and the second metal oxide layer is substantially uniform.

* * * * *